US009413148B2

(12) United States Patent
Sagdic

(10) Patent No.: US 9,413,148 B2
(45) Date of Patent: Aug. 9, 2016

(54) ELECTRIC WALL FEEDTHROUGH FOR SOLAR INSTALLATIONS

(71) Applicant: Phoenix Contact GmbH & Co. KG, Blomberg (DE)

(72) Inventor: Mehmet Sagdic, Detmold (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 171 days.

(21) Appl. No.: 14/382,786

(22) PCT Filed: Mar. 12, 2013

(86) PCT No.: PCT/EP2013/055003
§ 371 (c)(1),
(2) Date: Sep. 4, 2014

(87) PCT Pub. No.: WO2013/135698
PCT Pub. Date: Sep. 19, 2013

(65) Prior Publication Data
US 2015/0047898 A1    Feb. 19, 2015

(30) Foreign Application Priority Data

Mar. 15, 2012  (DE) .................. 10 2012 005 043

(51) Int. Cl.
*H02G 3/06* (2006.01)
*H01R 13/506* (2006.01)
(Continued)

(52) U.S. Cl.
CPC .......... *H02G 3/0616* (2013.01); *H01B 17/583* (2013.01); *H01R 13/506* (2013.01); *H01R 13/746* (2013.01); *H01R 4/4818* (2013.01); *H01R 2101/00* (2013.01)

(58) Field of Classification Search
USPC ......................................... 174/567
See application file for complete search history.

(56) References Cited

U.S. PATENT DOCUMENTS 4,234,218 A * 11/1980 Rogers ................ B29C 61/0608
174/153 G
4,738,636 A * 4/1988 Bolante .................. H01R 13/59
174/652

(Continued)

FOREIGN PATENT DOCUMENTS

CN    102332658 A    1/2012
DE    102008061268    6/2010

(Continued)

OTHER PUBLICATIONS

Japan Office Action, Application No. 2014-561420, Applicant: Yuzuru Okabe, et al., Mail Date: Aug. 25, 2015.

(Continued)

*Primary Examiner* — Timothy Thompson
*Assistant Examiner* — Krystal Robinson
(74) *Attorney, Agent, or Firm* — Reising Ethington PC

(57) ABSTRACT

A wall feedthrough is provided, which is pluggable on one side, for connecting a voltage-carrying conductor of a solar generator to a combiner box housing. A two-part connector housing having a front housing part and an insert part which can be moved together with an electric terminal element as one unit relative to the front housing part, wherein the terminal element is pluggable on one side and has a spring-force clamp on the other side, and wherein in the closed state, the spring-force clamp is surrounded by a body sleeve of the front housing part, and in the open state the clamping device is pulled out of the body sleeve so as to be openable and closable, and wherein, for this purpose, the insert part has an exposed handle portion for the user.

17 Claims, 8 Drawing Sheets

(51) Int. Cl.
H01R 13/74 (2006.01)
H01B 17/58 (2006.01)
*H01R 4/48* (2006.01)
*H01R 101/00* (2006.01)

(56) References Cited

U.S. PATENT DOCUMENTS

| | | | | |
|---|---|---|---|---|
| 5,667,257 | A * | 9/1997 | Butler | F16L 37/008 285/212 |
| 6,034,325 | A * | 3/2000 | Nattel | H01R 9/03 174/59 |
| 6,517,381 | B2 | 2/2003 | Kondo | |
| 6,730,849 | B2 * | 5/2004 | Koessler | H02G 15/013 174/650 |
| 8,283,579 | B2 * | 10/2012 | Lin | H02G 3/088 174/651 |
| 2009/0272574 | A1 * | 11/2009 | Richter | H01R 13/5202 174/548 |
| 2010/0093231 | A1 * | 4/2010 | Lauermann | H01R 13/5205 439/852 |
| 2011/0318975 | A1 | 12/2011 | Giefers et al. | |

FOREIGN PATENT DOCUMENTS

| | | |
|---|---|---|
| DE | 102010034881 | 2/2012 |
| DE | 202010007145 | 2/2012 |
| DE | 102011112283 A1 | 3/2013 |
| JP | 4831505 | 12/2011 |

OTHER PUBLICATIONS

Chinese Office Action, Applicant No. 201380013074.2, Name of Applicant: Phoenix Contact GmbH & Co. KG, Title: Electric Wall Feedthrough for Solar Installations, Mail Date: Dec. 28, 2015.

EP Office Action, Serial No. 13 709 191.4-1801, Applicant: Phoenix Contact GmbH & Co. KG, Mail Date: Dec. 30, 2015.

International Search Report and Written Opinion, Int. Serial No. PCT/EP2013/055003, Int. Filing Date: Mar. 12, 2013, Applicant: Phoenix Contact GmbH & Co. KG, Mail Date: Jun. 6, 2013.

German Office Action, Serial No. 10 2012 005 043.7, Filing Date: Mar. 15, 2012, Applicant: Phoenix Contact GmbH & Co. KG, Mail Date: Dec. 12, 2012.

* cited by examiner

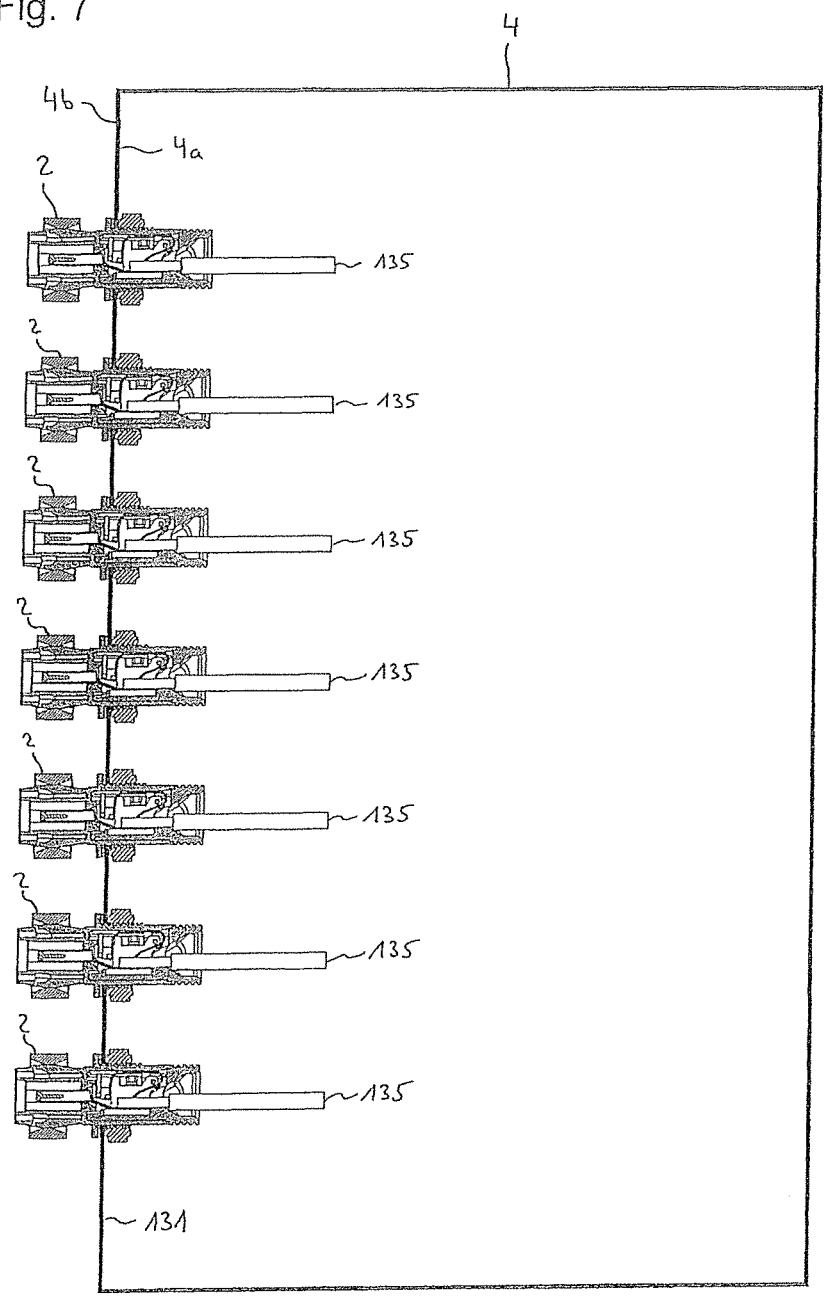

ELECTRIC WALL FEEDTHROUGH FOR SOLAR INSTALLATIONS

TECHNICAL FIELD

The present disclosure relates to an electric wall feedthrough pluggable on one side for connecting a voltage-carrying cable of a solar generator to a connection box housing, in particular to a combiner box of the solar installation, which should in particular be compatible with existing connector systems for solar installations.

BACKGROUND

Solar modules are typically connected in series in so-called strings, and depending on the size of the solar generator several strings are connected in parallel. The power cabling of solar modules must meet a number of requirements for this purpose. Firstly, string voltages are currently typically up to 1000 volts, and currents are in the ampere range. Furthermore, the connection cables are at least partially routed in the open air, so that certain requirements must be met in terms of water resistance.

For this purpose, the Applicant has developed a connector system under the brand SUNCLIX® that meets the specified requirements in an outstanding manner. The SUNCLIX® connector system includes single-pole electric connectors having a metal terminal element which is designed for the electric voltages and currents required in the solar sector.

For solar installations, wall feedthroughs are possibly needed for electric feedthrough through a housing wall of a connection box, e.g. the housing wall of a combiner box or string combiner box. So it may be desirable for a connector to be directly installed in a wall of the connection box housing, so that the mating connector can directly be plugged to the housing.

For this purpose, DE 10 2011 112 283 describes a single-pole electric wall feedthrough pluggable on both sides for cabling solar installations. Such feedthroughs may, for example, be used for string combiner boxes. Such a wall feedthrough pluggable on both sides is very easily operated by the user. However, it is a relatively complex solution which moreover requires a lot of space within the connection box housing which, on the other hand, it is not always compensated by the advantages of the two-sided pluggable connection.

A wall-mountable electric connector with a multi-part housing is described in DE 10 2010 034 881. Although this connector is suitable for a variety of application fields, the ease of operation and the compatibility for certain applications in solar technology are further improvable.

Due to the huge cost pressure, it is moreover desirable to keep the production, storage and logistics costs of a connector system for photovoltaic systems as low as possible on the one hand, and yet to provide for a flexible, but still simple and reliable installation when cabling solar systems on the other hand.

SUMMARY

Therefore, an object of the present disclosure is to provide an electric wall feedthrough for connecting a voltage-carrying cable of a solar generator to a connection box housing, in particular to a combiner box housing of the solar installation, which is simple to operate and requires small space.

Another object of the present disclosure is to provide a freely configurable wall feedthrough, to which, when installed, a conductor can be reversibly connected and disconnected therefrom in simple manner on the inner side of the housing.

Another object of the present disclosure is to provide a wall feedthrough which can be integrated into an existing connector system with as few new components as possible.

Another object of the present disclosure is to provide a wall feedthrough which exhibits high contact reliability and good protection against the penetration of moisture into the connection box housing.

The object of the present disclosure is achieved by the subject matter of the independent claims. Other embodiments of the present disclosure are specified in the dependent claims.

According to the present disclosure, a single-pole wall feedthrough is provided, which is pluggable on one side for connecting a voltage-carrying cable of a solar generator to a connection box housing, in particular a housing of a combiner box. The wall feedthrough comprises an insulating connector housing with an external stop or abutment collar and a mounting portion, e.g. a threaded portion. The connector housing is mounted in an opening in a wall of the combiner box housing by means of a separate mounting element that cooperates with the mounting portion, for example by screwing a mounting nut to the threaded portion of the connector housing, and the wall of the combiner box housing is clamped between the stop and the mounting element.

Further, the connector housing is formed at least in two parts. As a first part, the connector housing comprises a front housing part that extends outwards from the combiner box housing, comprising a front side plug-in portion in form of a housing plug pin or a housing plug socket, a body sleeve for being inserted into an opening of the wall of the connection box housing or of the combiner box housing, and a stop collar arranged between the plug-in portion and the mounting portion of the body sleeve, wherein the connector housing is fixed in the opening, particularly screwed, with the stop collar on the one side and the mounting element on the other side. As a second part, the connector housing comprises a plastic insert part which is inserted into the preferably one-piece front housing part at a rear axial end thereof opposite to the plug-in portion.

A metallic electric terminal element axially extends within the connector housing, which terminal element comprises a front metal plug-in terminal or contact and a rear clamping device for a stripped conductor end. The rear clamping device, in particular in form of a spring-force clamp, enables to reversibly and non-destructively release and reconnect the stripped conductor end. The stripped conductor end is electrically connected to the metal plug-in terminal by means of the terminal element which in the installed state extends through the opening transversely through the housing wall, when the conductor end is firmly clamped in the clamping device, so as to electrically connect the conductor in the installed and assembled state in the combiner box housing with a mating connector outside the combiner box housing.

The electric terminal element is fixed within the preferably one-piece plastic insert part, e.g. latched. The insert part is guided slideably along its longitudinal extension in the body sleeve, so that the insert part together with the electric terminal element fixed therein can be reversibly inserted (pushed in) and retracted (pulled out) as a unit between a closed state of the connector housing when inserted into the body sleeve and a retracted open state of the connector housing.

In the closed state of the connector housing, the clamping device is surrounded by the front housing part or the rear body sleeve thereof, so as to be completely enclosed, and the metal plug-in terminal is arranged in the front plug-in portion of the front housing part, so that it can be mated with a complementary metal plug-in terminal of the complementary mating connector.

When opening the connector housing, the insert part is retracted rearwardly out of the front housing part to a certain extent, typically a few centimeters, together with the terminal element fixed therein. Thus, in the open state of the connector housing the metal plug-in terminal is at least partially pulled out rearwardly from the plug-in portion, and the clamping device is pulled out from the body sleeve to such an extent that it can be opened and closed by the user. When using a spring-force clamp, the latter is pulled out from the body sleeve at least to an extent that the clamping spring can be opened and closed by the user.

For connecting the rear stripped conductor end in the open state, the conductor end is therefore inserted from the rear into the clamping device which is in particular designed as a spring-force clamp, subsequently the clamping device is closed and then the insert part is re-inserted into the front housing part in the direction towards the plug-in portion, in order to close the connector housing. Thus, the wall feedthrough may be freely assembled (cut to length and terminated) by the user. The spring-force clamp may optionally be configured in such a way that the stripped conductor end can be inserted not only into the opened but also into the closed spring-force clamp. This is often referred to as a direct plug-in technology. Such a spring-force clamp with direct plug-in technology is described, for example, in DE 10 2008 061 268, which is hereby incorporated by reference. The insertion of the insert part into the front housing part and the retracting from the front housing part may be performed reversibly when in the installed state in the wall opening of the combiner box housing.

Thus, the wall feedthrough comprises a plug-in connector at one of its two axial ends, and at the other axial end a spring-force clamp enclosed in the connector housing, but retractable.

Thus, the wall feedthrough may be reversibly disconnected and reconnected on both sides, on the outer side of the combiner box housing by means of the plug-in connector, and on the inner side of the combiner box housing by means of the spring-force clamp that can be pulled out from the front housing part, and both in the installed state.

Further, a short configuration can be achieved, so that the space requirement in the combiner box housing is relatively low. Nevertheless, the wall feedthrough is very easily operated by the user, can freely be assembled (cut to length and terminated) and provides reliable contact.

In addition, the leverage forces on the wall feedthrough screwed tightly into the opening are relatively low, due to the short configuration thereof both on the inner side of the combiner box housing and on the outer side of the combiner box housing.

Finally, the wall feedthrough can be compatibly integrated into an existing photovoltaic pluggable connector system, and some components can be taken from the existing connector system or only need to be slightly modified. Preferably, the terminal element is tapering between the clamping device and the metal plug-in terminal, and the front housing part has a complementary taper of the inner passage in which the terminal element is axially moved or displaced. In the closed state of the connector housing, due to the mutual engagement of the tapered sections the terminal element is joined relatively water-tightly to the front housing part. More preferably, the terminal element is stamped from sheet metal material and has a hollow shape, and a plastic stopper is inserted into the hollow male metal plug-in terminal, as a contact protection.

Preferably, the body sleeve comprises a rear sleeve portion at its end axially opposite to the plug-in portion of the front housing part, so that the mounting portion is arranged between the sleeve portion and the stop collar. In the closed state, the rear clamping device is preferably at least partially enclosed by the rear sleeve portion. The greater part of the overall length of the wall feedthrough can thus be arranged on the inner side of the combiner box housing in the closed state. In other words, the axial length of the mounting portion, the sleeve portion and a handle portion of the insert part in total is greater than or equal to the length of the plug-in portion or greater than or equal to the total length of that portion of the connector, which protrudes on the outer side of the housing wall in the installed state.

In this way, relatively large leverage forces on the external plug connector can be absorbed.

Preferably, the insert part has an intermediate portion in the region of the clamping device, which has a substantially U-shaped cross section and which radially opens to at least one side. Further, the clamping device is preferably formed as a spring-force clamp that is radially actuatable relative to the connector housing and includes a support frame and a clamping spring pivotally mounted in the support frame. The spring-force clamp, more precisely the support frame thereof, is preferably fixed in the intermediate portion in such a manner that the clamping spring is radially exposed through the radially opening side of the U-shaped cross section for being actuated, so that the spring-force clamp can be reversibly opened and closed by the user when the connector housing is in the open state.

Thus, the clamping device is very easily operated by the user, even if the wall feedthrough is screwed tightly into the opening of the combiner box housing.

According to a preferred embodiment, the clamping spring and the support frame of the spring-force clamp comprise mutually complementary latching means, by means of which the clamping spring is latched with the support frame in the closed state of the spring-force clamp, whereby a high contact reliability of the clamping device is guaranteed.

In the closed state of the spring-force clamp and the connector housing, in addition to the latching with the support frame, the clamping spring is preferably enclosed by the body sleeve so tightly that the sleeve body prevents the clamping spring from springing open. As a result, the contact reliability can be further increased and the installation size can be kept small.

In particular, the clamping spring comprises an actuating arm for being actuated by a finger of a user, a clamping arm for clamping the stripped conductor end to a power rail of the support frame, and an elbow portion, which connects the actuating arm to the clamping arm. Further, preferably, in the region of the elbow portion the clamping spring is pivotally mounted in the support frame. In the closed state, the actuating arm is latched with the support frame, for example by lateral latching protrusions on the actuating arm, which latch with latching hooks on the support frame. The actuating arm and the clamping arm extend from the pivot axis towards the plug-in portion (forwardly), and the actuating arm is secured from springing open by the body sleeve in the closed state, because the actuating arm engages the inner surface of the body sleeve, preferably in the region of the threaded portion in the axial direction. Preferably, the clamping arm is configured to be elastically resilient to an extent so that even in the closed state of the spring-force clamp, the stripped conductor end can be inserted from the rear, with the clamping arm giving way (direct plug-in technology), whereby a high level of operating comfort is achieved through different operation possibilities.

According to an embodiment of the present disclosure, the insert part has a rear handle portion or grasp portion at its rear end (arranged axially opposite to the plug-in portion of the connector housing), on which the user can hold or grasp the insert part to insert it into the body sleeve and pull it out from the body sleeve. For this purpose, the handle portion preferably has an at least partially circumferential outer corrugation. Hereby, the insertion and retraction of the insert part into or from the front housing part is facilitated.

In particular, the handle portion integrally formed with the plastic insert part defines the rear end of the wall feedthrough and is exposed, even in the closed state of the connector housing. In other words, a rear sleeve nut can be dispensed with.

Preferably, in the closed state of the connector housing the handle portion is axially adjacent to the sleeve portion of the body sleeve. If applicable, the handle portion directly adjoins the sleeve portion, so that the rear end of the sleeve body forms a stop for the handle portion when inserted.

The outer diameter of the handle portion, in particular of the corrugation, should be selected smaller than or equal to the diameter of the mounting portion of the body sleeve, so that the connector housing can be inserted with the insert part inserted in the front housing part, together as a pre-assembled unit, through the opening in the wall of the combiner box housing. Preferably, in the closed state of the connector housing, the handle portion or the outer diameter of the corrugation on the outer side flushes with the sleeve portion of the body sleeve.

This has the advantage that the front housing part and the insert part may already be assembled at the factory and may be delivered to the customer and/or mounted as a pre-assembled combined module.

Preferably, the handle portion has an inner insertion funnel for the conductor end at its (rear) end axially opposite to the plug-in portion of the front housing part, which tapers in the direction towards the clamping device. Thereby, the insertion of the stripped conductor end can be facilitated.

For good guidance of the insert part when being inserted and retracted, at least one retaining tab extends axially rearwards from the rear end of the body sleeve and slides along a sliding surface of the insert part when the insert part is moved in the body sleeve. Preferably, the corrugation of the handle portion is interrupted on the sliding surface, and in the closed state the retaining tab axially extends into the corrugation. In this manner, the overall length can be kept small.

In the closed state of the connector housing, the insert part is latched with the front housing part. Thereby, unintended retraction of the insert part from the front housing part is prevented, without an additional screw connection being necessary, for example.

For this purpose, at least one retaining tab preferably has an opening which in the closed state is latched to a rear latching protrusion in the sliding surface. Further, preferably, at least one retaining tab has an opening, which in the open state is latched to a front latching protrusion arranged in the sliding surface. In this way, both the open and the closed state are secured against accidental displacement of the insert part relative to the front housing part, because first the latching has to be released or overcome.

According to one preferred embodiment of the present disclosure, at least two radially opposed retaining tabs extend axially rearwards from the rear end of the body sleeve and slide along two radially opposed sliding surfaces of the insert part when the insert part is displaced in the body sleeve. However, only one of the sliding surfaces has a rear latching protrusion.

Thus, the user may release the latching in the closed state of the connector housing with only one single manipulation, for example using a tool such as a screwdriver, so that release of the latching is simplified.

The directional terms "front"/"front side" or "rear"/"rearwards" refer to the longitudinal axis of the wall feedthrough which in the installed state extends transversely to the wall of the combiner box housing. "Front" or "front side" refer to the side with the plug-in portion which is typically arranged on the outer side of the combiner box housing, and "rear" or "rearwards" refer to the side of the wall feedthrough axially opposite to the plug-in portion, where the clamping device is arranged and which is typically arranged on the inner side of the combiner box housing.

The present disclosure will now be explained in more detail by way of exemplary embodiments and with reference to the figures, wherein identical and similar elements are partly provided with the same reference numerals, and wherein the features of the different exemplary embodiments may be combined with each other.

BRIEF DESCRIPTION OF THE FIGURES

In the drawings:

FIG. 1a is a perspective view obliquely from the rear right;
FIG. 1b is a perspective view obliquely from the rear left;
FIG. 1c is a bottom view;
FIG. 1d is a right side view;
FIG. 1e is a top view;
FIG. 1f is a left side view;
FIG. 1g is a sectional view taken along line A-A in FIG. 1f;
FIG. 1h is a rear view;
FIG. 1i is a front view;
FIG. 1j is a sectional view taken along line B-B in FIG. 1i;
FIG. 6a is a perspective view obliquely from the rear right;
FIG. 6b is a perspective view obliquely from the front left;
FIG. 6c is a bottom view;
FIG. 6d is right side view;
FIG. 6e is a top view;
FIG. 6f is a left side view;

FIG. 7 illustrates a combiner box housing with a plurality of installed wall feedthroughs according to the present disclosure.

DETAILED DESCRIPTION

Figure 1A:
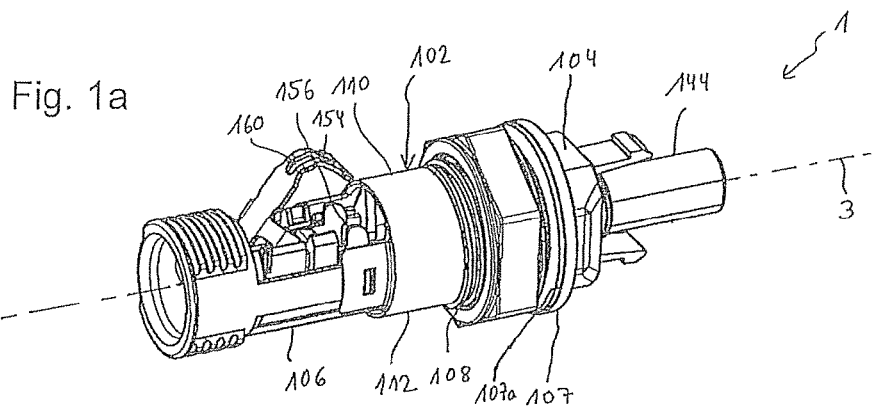
FIGS. 1a to 1j are different views of a wall feedthrough according to the present disclosure with a female plug-in terminal in the open state, as follows.
Figure 1B:
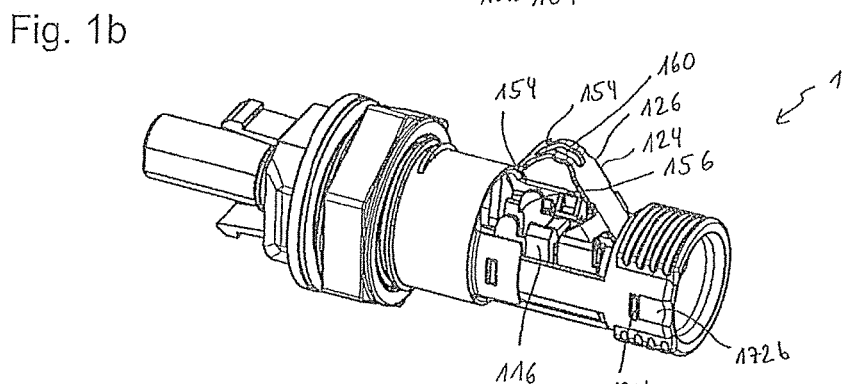
Figure 1C:
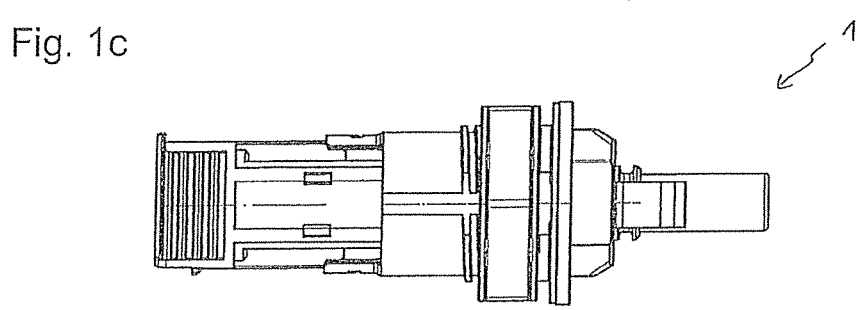
Figure 1D:
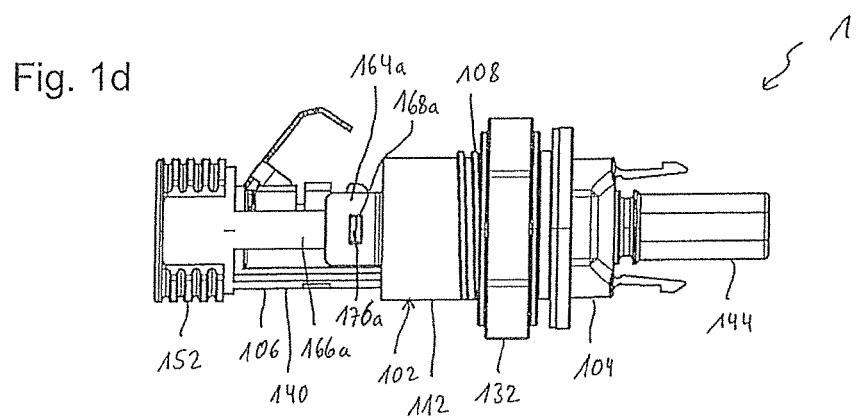
Figure 1E:
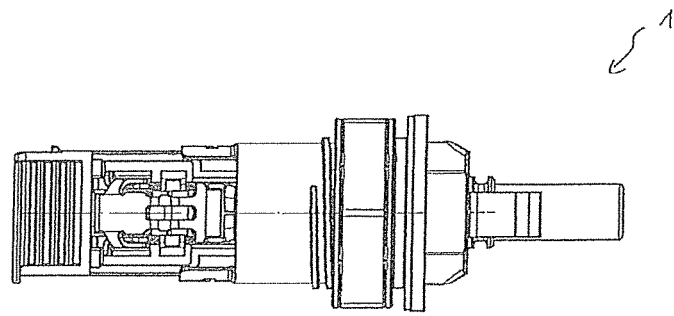
Figure 1F:
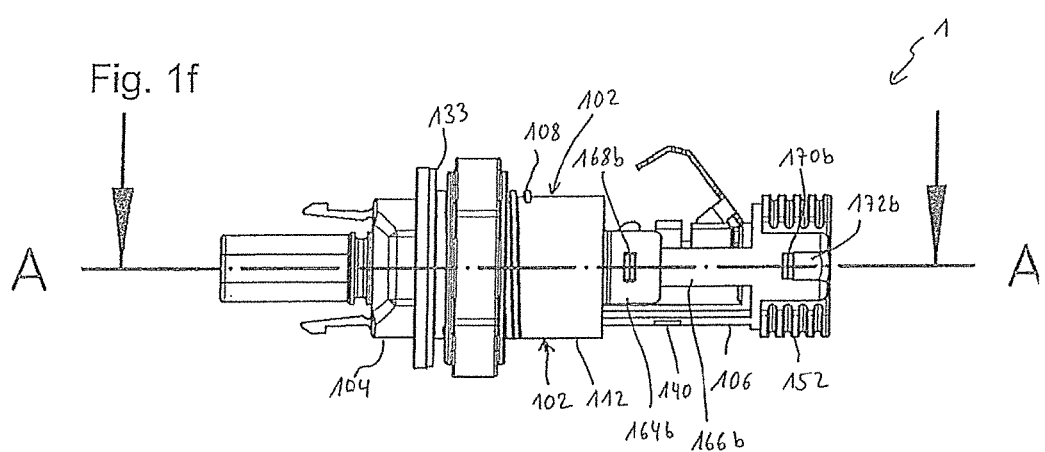
Figure 1G:
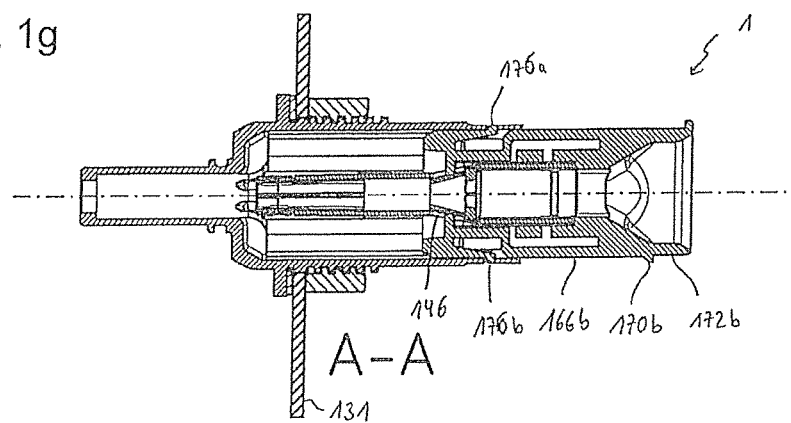
Figure 1H:
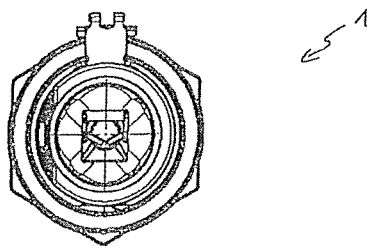
Figure 1I:
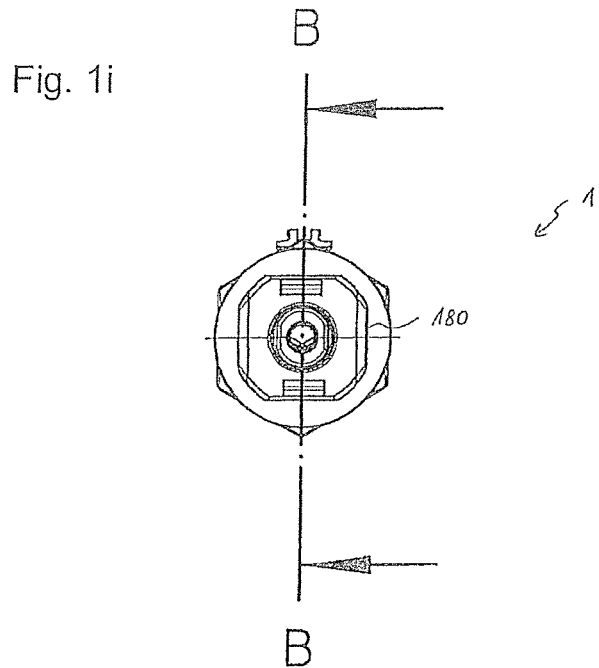

FIGS. 1a to 1j show an electrical wall feedthrough 1 according to the present disclosure with a female plug-in terminal or contact. The wall feedthrough 1 comprises a two-part connector housing 102 which consists of a front housing part 104 with a front plug-in portion and a rear insert part 106 which is inserted into the front housing part 104 from the rear and is slidable along a longitudinal axis 3 of wall feedthrough 1 (axially) in the front housing part 104. The one-piece front housing part 104 comprises a front plug-in portion 144 and a rear body sleeve 110, and a stop collar 107 arranged between the plug-in portion 144 and the body sleeve 110. Body sleeve 110 is divided into an outer thread rearwardly adjoining stop collar 107, and a sleeve portion 112 rearwardly adjoining threaded portion 108. Accordingly, the body sleeve 110 mainly consists of threaded portion 108 and smooth sleeve portion 112 which extends the threaded portion 108 to the rear.

Figure 1J:
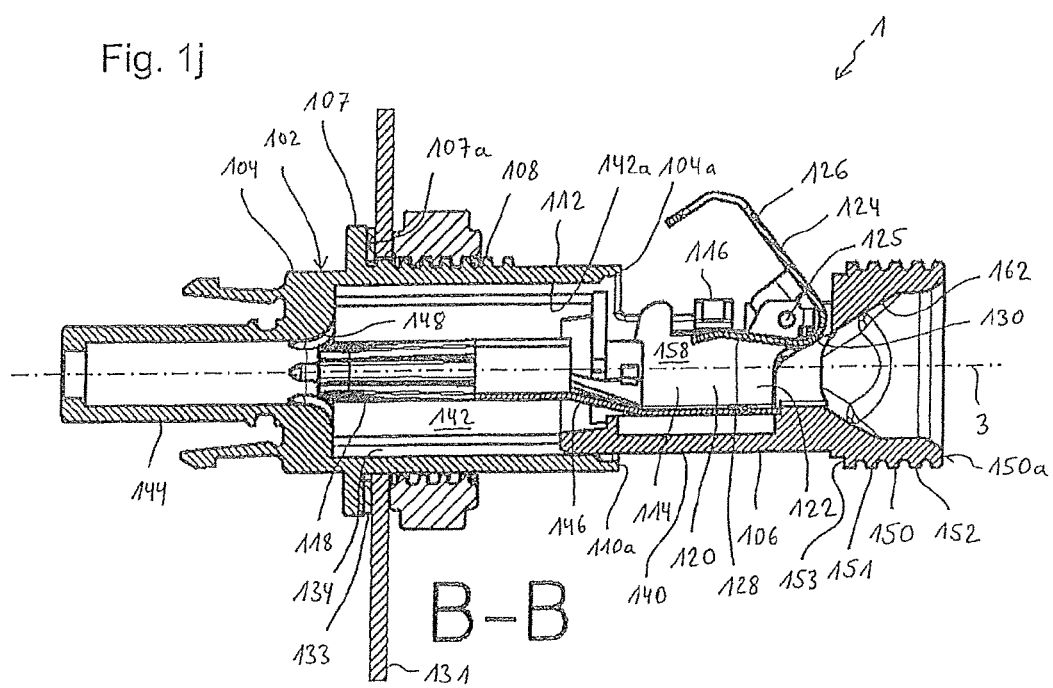

FIG. 1j shows the wall feedthrough with the connector housing open and the spring-force clamp open. The terminal element 114 is latched into the insert part 106 by means of two latching hooks 116 of insert part 106 and thus secured and fixed. Terminal element 114 consists of a front plug-in terminal 118 and a rear spring-force clamp 120. The support frame 122 of spring-force clamp 120 is stamped and formed integrally with plug-in terminal 118, the support frame 122 being substantially U-shaped and the plug-in terminal 118 has a hollow shape. Spring clamp 124 is pivotally mounted about a transverse pivot axis 125 in support frame 122 and comprises an actuating arm 126, a clamping arm 128 and an elbow portion 130 connecting the two arms 126, 128.

The stop collar 107 has an annular rear stop surface 107a. The wall feedthrough 1 is inserted into the opening 134 of housing wall 131 with the insert part 106 and the body sleeve 110, and is then fixed with mounting nut 132. In this installed state, the wall 131 is clamped between stop surface 107a of stop collar 107 and mounting nut 132, in order to fix the wall feedthrough in the opening 134 in wall 131. Wall feedthrough 1 is sealed with an O-ring 133 around body sleeve 110 between stop collar 107 and mounting nut 132. For this purpose, the threaded portion 108 extends from the rear almost directly up to the stop surface 107a of stop collar 107.

Figure 2J:
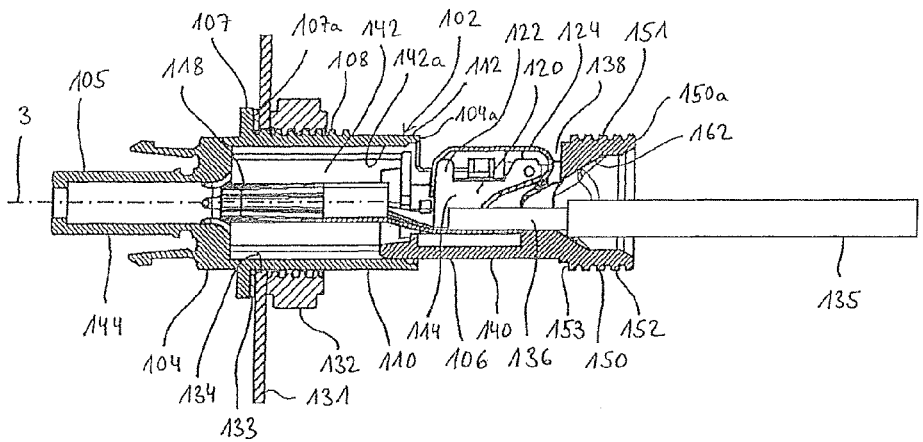
FIG. 2j is a sectional view similar to FIG. 1j, with the spring-force clamp closed and the conductor inserted.

Referring to FIG. 2j, the stripped conductor end 136 is inserted from back into the spring-force clamp 120, and the user may close the clamping spring 124 from above through the radial opening 138 of the U-shaped intermediate portion 140 of insert part 106, for example with a touch of a finger, whereupon the clamping spring 124 is latched in support frame 122. Subsequently, the insert part 106 is inserted by the user into the passage 142 in the front housing part 104, with the terminal element 114 fixed therein, whereby at the same time the plug-in terminal 118 is automatically inserted into the front plug-in portion 144. The integrally molded plastic insert part 106 with the terminal element 114 fixed therein forms a unit which is shifted as a whole relative to the front housing part 104.

When inserting the insert part 106 into the front housing part 104 from the open to the closed state of connector housing 102, the spring-force clamp 120 is displaced from a position behind and outside the body sleeve 110 into the body sleeve 110, namely in this example at least partially up into the threaded portion 108. In the closed state of the connector housing 102, the spring-force clamp 120 axially extends up into the threaded portion 108, or more precisely, the spring-force clamp 120 is arranged at an axial position within the sleeve portion 112 and the threaded portion 108.

Figure 3J:
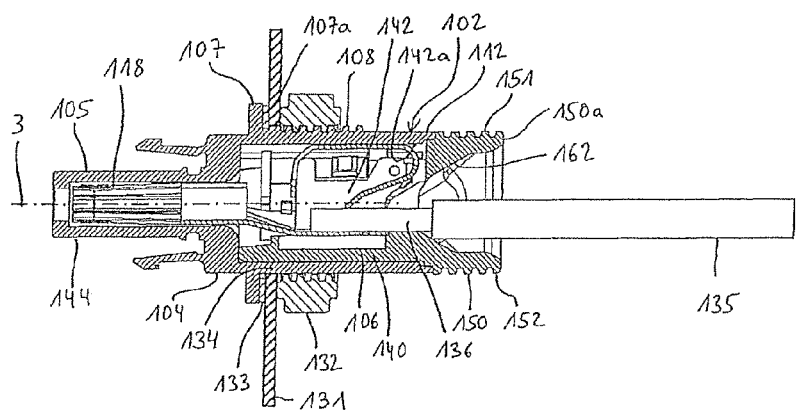
FIG. 3j is a sectional view similar to FIG. 2j, but with the connector housing closed.

FIG. 3j shows the inserted state of the insert part 106, i.e. the closed state of connector housing 102 in which a mating connector, not shown, may be connected to wall feedthrough 1. The terminal element 114 has a tapering area 146 between plug-in terminal 118 and spring-force clamp 120, which tapers towards the front and which in the closed state of the connector housing 102 is arranged in the tapered area 148 of front housing part 104.

For inserting the insert part 106 into the passage 142 which axially extends through the front housing part 104, the insert part 106 has a rear handle portion 150 adjacent the intermediate portion 140. Handle portion 150 has a substantially circular cylindrical shape. The diameter of handle portion 150 is larger than the inner diameter of the passage 142 in front housing part 104, so that the handle portion 150 cannot slide into the front housing part 104. Furthermore, the handle portion 150 has a handle surface 151 on its outer circumference, which extends circularly around longitudinal axis 3, at least partially, with an interrupted circularly extending corrugation 152. Thus, the user may easily grip the handle portion 150 between his thumb and forefinger, in the open and in the closed state of connector housing 102, in order to insert (push in) the insert part 106 into passage 142 of front housing part 104 and also to retract it (pull it out). Both is possible in the installed state in wall opening 134, if applicable even when the mating connector, not shown, is plugged. Thus, the user can at any time pull out the insert or plug part 106 from front housing part 104 until the spring-forced clamp 120 is released, and can open the spring-force clamp 120 in this open state of the connector housing 102 in order to release the conductor end 136. Thus, a conductor end 136 may be repeatedly connected and disconnected for an almost unlimited number of times, or the conductor 135 may be freely assembled (cut to length and terminated), reversibly connected and replaced at any time.

The mounting nut 132 is relatively short in the axial direction. As such, the mounting nut 132 has an axial length which is shorter than the length of the body sleeve 110 as measured from the stop collar 107 to the rear end 104a of front housing part 104. In the exemplary embodiment shown, the length of the mounting nut 132 is only about a quarter of the length of the body sleeve 110 as measured from the stop collar 107 to the rear end 104a of front housing part 104. In the closed state of connector housing 102, mounting nut 132 and threaded portion 108 are axially in the front area of spring-force clamp 120. In particular, in the installed state, mounting nut 132 does not extend rearwards up to the handle portion 150 and especially not beyond the rear end 150a of handle portion 150, so that the handle portion 150 is freely accessible to the user. Mounting nut 132 or the mounting element is merely an ordinary nut and in particular no hat-shaped screw cap with an inner thread. Hence, the mounting element in particular does not have the function to close the connector housing 102 at the rear end.

Handle portion 150 has a front stop 153 which in the closed state of the connector housing 102 abuts on the rear side 110 of body sleeve 110. Thus, the handle portion 150 of the insertion part 106 protrudes from the front housing part 104 or from the body sleeve 110 both in the open and the closed state of the connector housing 102 and thus is exposed, so that it can be gripped by the user. Accordingly, even in the closed state the insert part 106 will not be completely enclosed by the connector housing 102. Consequently, the handle surface 151 of handle portion 150 is freely accessible to the user in the open and in the closed state of the connector housing 102, in particular it can be gripped from two radially opposite sides.

Referring again to FIGS. 1a and 1b, the actuating arm 126 of clamping spring 124 has two lateral latching tabs 154 that engage under latch hooks 156 of the lateral edges 158 of support frame 122. This latching may be levered open via an opening 160 stamped into the actuator arm 126, so that the spring force clamp can be reversibly closed and opened by the user.

Referring again to FIG. 3j, in the closed state of connector housing 102, the actuating arm 126 of clamping spring 124 is secured from springing open by engaging the inner surface 142a of passage 142, in addition to the latching with support frame 122.

The outer diameter of handle portion 150 or of the transverse corrugation 152 is approximately equal to the outer diameter of sleeve portion 112, to facilitate insertion of the pre-assembled connector housing 102 into the wall opening 134. In other words, the outer surface of sleeve portion 112 extends substantially flush with the handle portion 150.

For easy insertion of the conductor end 136, the handle portion 150 has a rear inner insertion funnel 162 which tapers from rear to front. Insertion funnel 162 is rigid and does not need to fulfill a clamping function. The clamping of conductor 135 within the combiner box housing is exclusively effected using spring-force clamp 120 which clamps the stripped conductor end 136 against the power bar or power rail 123 of support frame 122. Therefore, conductor 135 lies loosely in insertion funnel 162.

Referring again to FIGS. 1d and 1f, the front housing part 104 has rear retaining tabs 164a,b rearwardly directly adjacent to sleeve portion 112. When the insert part 106 is moved or shifted, retaining tabs 164a,b slide on sliding surfaces 166a,b on both sides of insert part 106. Sliding surfaces 166a,b extend axially at least over the intermediate portion 140 and up into the corrugation 152 which is interrupted on sliding surfaces 166a,b for this purpose. Each of retaining tabs 164a,b comprises a respective latching opening 168a,b. Sliding surfaces 166a,b have front lateral latching protrusions 176a,b which in the open state of the connector housing (FIG. 1a to 1j) are latched in openings 168a,b of retaining tabs 164a,b. However, only one of the two sliding surfaces 166a,b, in this example the left-hand sliding surface 166b as seen from the rear, has a rear latching protrusion 170b which in the closed state of the connector housing is latched in opening 168b of the left retaining tab 164b when the connector housing 102 is closed. The only one-sided latching in the closed state may be released with only a single manipulation. For this purpose, the insert part 106 includes a recess or groove 172b behind the rear latching protrusion 170b, for inserting a screwdriver and levering open the latching between opening 168b and rear latching protrusion 170b.

Figure 4A:
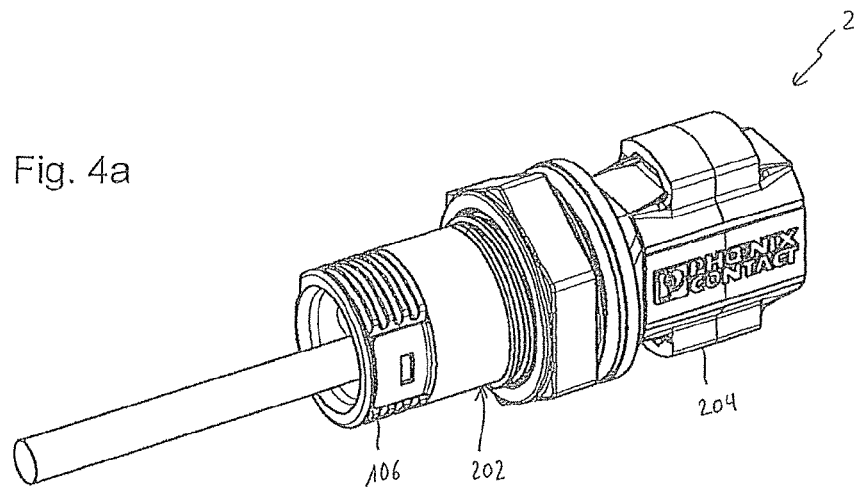
FIG. 4a is a perspective view obliquely from the rear right, of wall feedthrough complementary to FIGS. 1-3, with a male plug-in terminal.
Figure 4D:
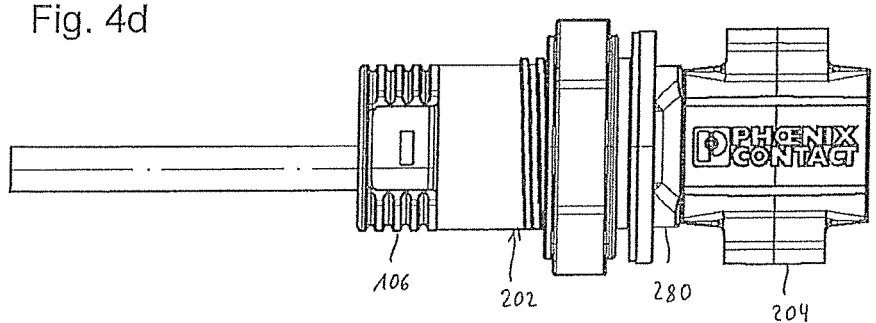
FIG. 4d shows the wall feedthrough of FIG. 4a in a side view from the right.
Figure 4J:
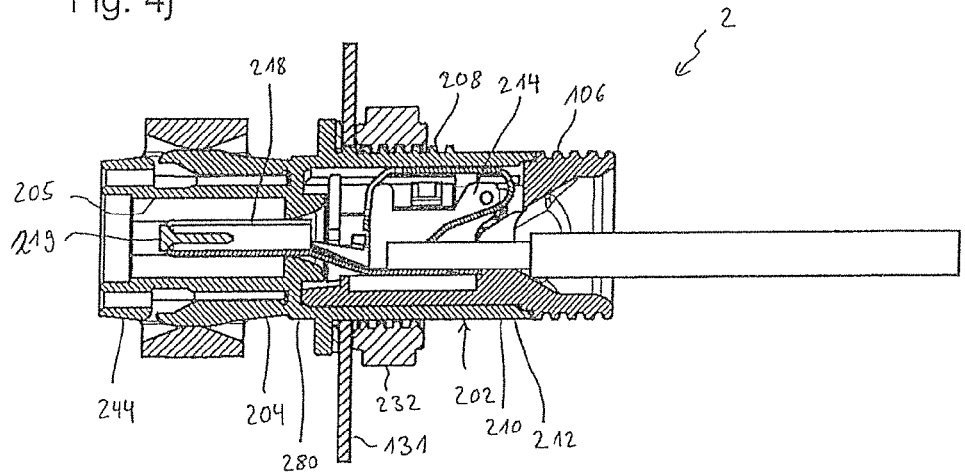
FIG. 4j is a longitudinal section similar to FIG. 3j, but through the wall feedthrough according to FIG. 4a and FIG. 4d.

FIGS. 4a, 4d and 4j show a complementary wall feedthrough 2 comprising a terminal element 214 with male plug-in contact or terminal 218. The plug-in terminal 218 formed from sheet metal material is closed with a plastic stopper 219 which serves as a contact protection. Otherwise, the male wall feedthrough 2 is configured similar to the female wall feedthrough 1, and corresponding parts are designated with reference numerals that have 200 numbers instead of 100 numbers, and the ones and tens digits are chosen to be equal.

Figure 5A:
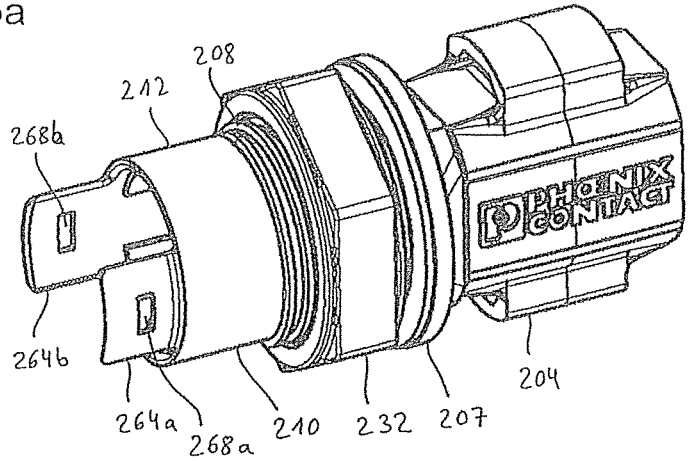
FIG. 5a is a perspective view obliquely from the rear right, of the front housing part of the wall feedthrough of FIG. 4a, with a mounting nut.
Figure 6A:
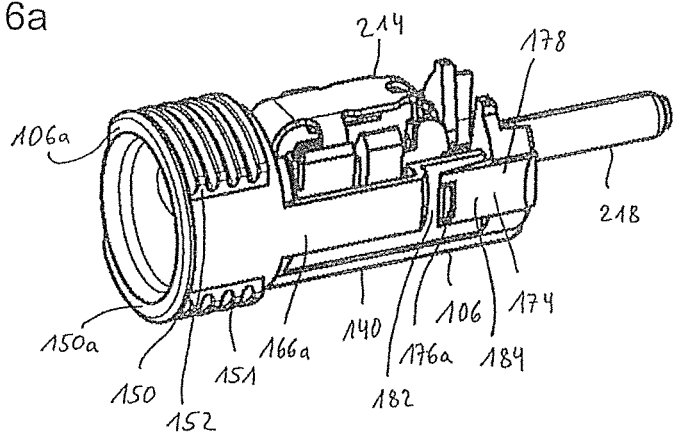
FIGS. 6a to 6f are different views of the insert part for the wall feedthrough of FIG. 4 with a fixed male terminal element, as follows.
Figure 6B:
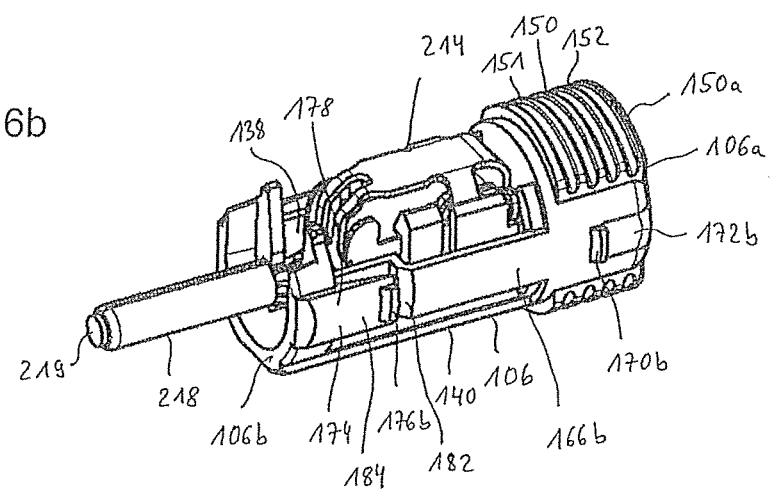
Figure 6C:
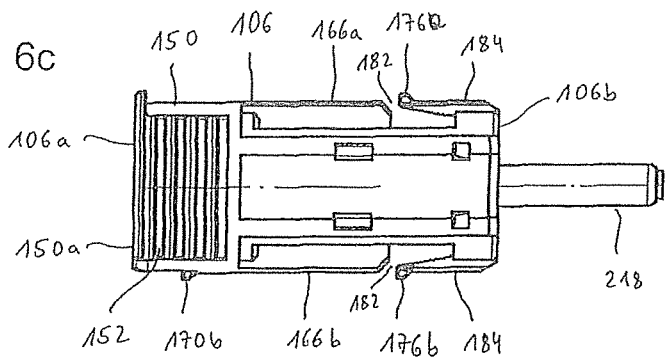
Figure 6D:
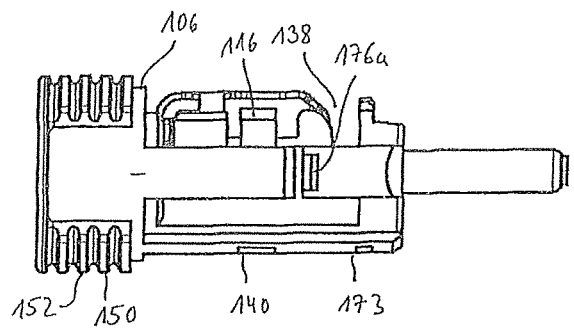
Figure 6E:
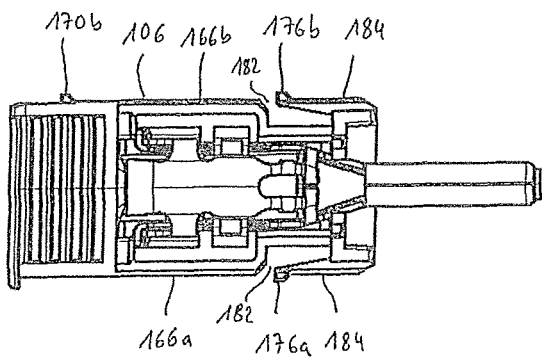
Figure 6F:
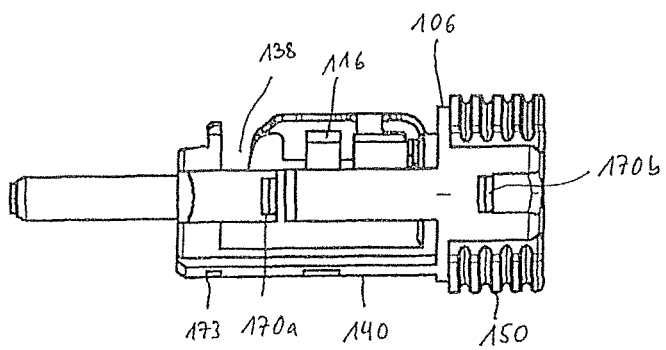

FIG. 5a shows the front housing part 204 of the male wall feedthrough 2.

FIGS. 6a to 6f show the insert part 106 with male terminal element 214 fixed therein. The inner geometry of passages 142, 242 of both wall feedthroughs 1, 2 has the same shape as far as it cooperates with the insert part 106, so that the same plastic insert part 106 can be used both for the male terminal element 214 or male wall feedthrough 2 and for the female terminal element 114 or female wall feedthrough 1. So only one type of insert parts 106 for both wall feedthroughs 1 and 2 (male and female) needs to be manufactured and stocked, so that costs can be saved.

The insert part 106 further has a front retaining portion 173 with two radially opposed, cantilevered and resilient front guide tabs 174 which extend the two sliding surfaces 166a,b towards the front and guide the insert part 106 in the passage 142 of front housing part 104. The front latching protrusions 176a,b are arranged on the outer surfaces of guide tabs 174 and engage in latching openings 168a,b of front housing part 104 when the insert part 106 is retracted, in order to prevent the insert part 106 from completely being pulled out. In the illustrated example, the front latching protrusions 176a,b will latch in openings 168a, 168b of retaining tabs 164a, 164b, whereby a particularly short design can be achieved.

Thus, the insert part 106 consists of three portions, the front retaining portion 173 which remains in the front housing part 104 even in the open state, the intermediate portion 140 which can be inserted into the front housing part 104 and retracted from the front housing part 104, and the handle portion 150 which cannot be inserted into the front housing part 104. The three portions are integrally made of plastic.

Referring again to FIG. 3j, 4j, in the installed and closed state of the connector housing, the rear part (which in the installed state is arranged on the inner side 4a of combiner box housing 4) comprising threaded portion 108, 208, sleeve portion 112, 212, and handle portion 150, is longer than the plug-in portion 144, 244 on the outer side 4b of combiner box housing 4. Furthermore, in the closed state of the connector housing 102, the clamping device 120 is arranged at least mostly rearwards of stop collar 7, or in the installed state on the inner side 4a of combiner box housing 4 (FIG. 7). Between stop collar 107, 207 and housing plug pin 105 or housing plug socket 205, the plug-in portion 144, 244 further has an outer polygonal geometry 180, 280, in order to hold the front housing part 104 against rotation when tightening the mounting nut 132, 232, e.g. using a wrench.

The insert part 106 comprises a front guiding portion 178 with two guide tabs 174, an intermediate portion 140 having a substantially U-shaped cross section for accessing clamping spring 124, and the rear substantially cylindrical handle portion 150, which are integrally molded as one part.

The plug-in terminal 118, 218 protrudes, substantially completely, from the front end 106b of insert part 106 opposite the rear end 106a of insert part 106 or the rear end 150a of handle portion 150, so that it can be inserted into plug-in portion 144 or 244.

The cantilevered guide tabs 174 form a front portion 184 of the sliding surface and extend the sliding surfaces 166a,b towards the front. Each front portion 184 of the sliding surface is separated from the associated sliding surface 166a,b by a respective narrow gap 182. Otherwise, the displacement of insert part 106 relative to the front housing part 104 is guided by retaining tabs 164a,b on the one hand, and by sliding surfaces 166a,b including the front portion 184, in order to accomplish a good linear guidance over the entire displacement range of the insert part 106 within front housing part 104 from the open to the closed state of connector housing 102.

FIG. 7 schematically shows the installation of a plurality of wall feedthroughs according to the present disclosure in the wall 131 of a connection or combiner box housing 4.

It will be apparent to those skilled in the art that the embodiments described above are intended as examples and that the invention is not limited thereto, but may be varied in many ways without departing from the scope of the claims. Furthermore, the features also define individually significant components of the present disclosure, irrespective of whether they are disclosed in the description, the claims, the figures, or otherwise, even if they are described together with other features.

The invention claimed is:

1. A wall feedthrough pluggable on one side, for connecting a voltage-carrying conductor of a solar generator to a connection box housing comprising:
   an insulating connector housing with a stop and a mounting portion;
   an electric terminal element extending axially within the connector housing; and
   a mounting element;
   wherein the connector housing is formed at least in two parts comprising
   i) a front housing part having a front plug-in portion in the form of a housing plug pin or a housing plug socket, a body sleeve for being inserted into an opening of a wall of the connection box housing, and the stop, wherein the connector housing can be fixed in the opening, with the stop on the one side and the mounting element on the other side; and
   ii) an insert part inserted into the front housing part at a rear axial end thereof opposite to the plug-in portion;
   wherein the electric terminal element comprises a front plug-in terminal and a rear clamping device for a conductor end for electrically connecting the conductor end with the plug-in terminal when the conductor end is clamped in the clamping device;
   wherein the electric terminal element is fixed within the insert part and the insert part is guided slideably along its longitudinal extension within the body sleeve, so that the insert part together with the electric terminal element fixed therein can be reversibly inserted and retracted between a closed state of the connector housing when inserted into the body sleeve and a retracted open state of the connector housing,
   so that in the closed state, the clamping device is surrounded by the body sleeve and the plug-in terminal is arranged in the plug-in portion, so as to be able to be mated with a complementary plug-in terminal of a mating connector, and
   so that in the open state, the plug-in terminal is at least partially pulled out of the plug-in portion and the clamping device is pulled out of the body sleeve so as to be openable and closable.

2. The wall feedthrough as claimed in claim 1, wherein the body sleeve comprises a sleeve portion at its end axially opposite to the plug-in portion of the front housing part, so that the mounting portion is arranged between the sleeve portion and the stop, and so that in the closed state the sleeve portion at least partially encloses the rear clamping device.

3. The wall feedthrough as claimed in claim 1, wherein in the region of the clamping device the insert part has an intermediate portion of a substantially U-shaped cross section, wherein the clamping device is formed as a spring-force clamp which is actuatable radially with respect to the connector housing and includes a support frame and a clamping spring pivotally mounted in the support frame, wherein the support frame is fixed in the intermediate portion and the clamping spring is radially exposed through the radially opening side of the U-shaped cross section and the spring-force clamp can be opened and closed reversibly when the connector housing is in its open state.

4. The wall feedthrough as claimed in claim 3, wherein the clamping spring and the support frame of the spring-force clamp comprise mutually complementary latching means by means of which the clamping spring is latched with the support frame in the closed state of the spring-force clamp.

5. The wall feedthrough as claimed in claim 4, wherein in the closed state of the spring-force clamp and the connector housing, in addition to being latched with the support frame, the clamping spring is enclosed by the body sleeve so tightly that the body sleeve prevents the clamping spring from springing open.

6. The wall feedthrough as claimed in claim 3, wherein the clamping spring comprises an actuating arm for being actuated by a finger of a user, a clamping arm for clamping the stripped conductor end to a power rail of the support frame, and an elbow portion which connects the actuating arm with the clamping arm, wherein in the region of the elbow portion the clamping spring is pivotally mounted in the support frame, wherein in the closed state the actuating arm is latched with the support frame, the actuating arm and the clamping arm extending from the pivot axis towards the plug-in portion, and the actuating arm is secured from springing open by the body sleeve in the closed state.

7. The wall feedthrough as claimed in claim 1, wherein the insert part has a handle portion at its rear end axially opposite to the plug-in portion of the connector housing, on which the user can hold the insert part for inserting into the body sleeve and retracting from the body sleeve.

8. The wall feedthrough as claimed in claim 7, wherein the handle portion has an at least partially circumferential outer corrugation.

9. The wall feedthrough claimed in claim 7, wherein in the closed state of the connector housing, the handle portion is axially adjacent to the sleeve portion of the body sleeve and the outer diameter of the handle portion is less than or equal to the diameter of the mounting portion of the body sleeve.

10. The wall feedthrough as claimed in claim 7, wherein in the closed state of the connector housing is axially adjacent to the sleeve portion of the body sleeve and the outer diameter of the handle portion is greater than the inner diameter of the sleeve portion.

11. The wall feedthrough as claimed in claim 7, wherein in the closed state of the connector housing, the outer surface of the handle portion flushes with the sleeve portion of the body sleeve.

12. The wall feedthrough as claimed in claim 7, wherein the handle portion has an inner insertion funnel for the conductor end at its end axially opposite to the plug-in portion of the front housing part, which tapers towards the clamping device.

13. The wall feedthrough as claimed in claim 1, wherein at least one retaining tab extends axially rearwards from the rear end of the body sleeve and slides along a sliding surface of the insert part when displacing the insert part within the body sleeve.

14. The wall feedthrough as claimed in claim 13, wherein the corrugation of the handle portion is interrupted on the sliding surface, and in the closed state the retaining tab axially protrudes into the corrugation.

15. The wall feedthrough as claimed in claim 13, wherein the at least one retaining tab has an opening which in the closed state of the connector housing is latched on a rear latching protrusion in the sliding surface.

16. The wall feedthrough as claimed in claim 15, wherein in the open state of the connector housing at least one opening in the retaining tabs is latched on at least one front latching protrusion arranged in the sliding surface.

17. The wall feedthrough as claimed claim 1, wherein at least two radially opposed retaining tabs extend axially rearwards from the rear end of the body sleeve and slide along two radially opposed sliding surfaces of the insert part when displacing the insert part within the body sleeve, wherein a rear latching protrusion is only provided on one of the sliding surfaces.

\* \* \* \* \*